United States Patent [19]

Hanada et al.

[11] Patent Number: 5,132,776
[45] Date of Patent: Jul. 21, 1992

[54] MEMBER FOR CARRYING A SEMICONDUCTOR DEVICE

[75] Inventors: Masazumi Hanada; Yoshinobu Takeda, both of Hyogo, Japan

[73] Assignee: Sumitomo Electric Industries, Ltd., Osaka, Japan

[21] Appl. No.: 668,794

[22] Filed: Mar. 6, 1991

Related U.S. Application Data

[63] Continuation of Ser. No. 426,882, Oct. 24, 1989, abandoned.

[30] Foreign Application Priority Data

Oct. 28, 1988 [JP] Japan ................. 63-273965
Oct. 31, 1988 [JP] Japan ................. 63-276564

[51] Int. Cl.$^5$ ................. H01L 39/02; C22C 21/00
[52] U.S. Cl. ................. 357/81; 357/67; 420/528; 420/548
[58] Field of Search ........... 357/81, 67; 420/548, 420/528

[56] References Cited

U.S. PATENT DOCUMENTS

| | | | |
|---|---|---|---|
| 4,069,497 | 1/1978 | Steidlitz | 357/81 |
| 4,172,261 | 10/1979 | Tsuzuki et al. | 357/81 |
| 4,352,120 | 9/1982 | Kurihara et al. | 357/81 |
| 4,686,083 | 8/1987 | Takizawa et al. | 420/548 |
| 4,760,240 | 7/1988 | Iikawa et al. | 219/121.64 |
| 4,830,820 | 5/1989 | Itoh et al. | 419/23 |
| 4,914,551 | 4/1990 | Anschel et al. | 357/81 |
| 4,926,242 | 5/1990 | Itoh et al. | 357/81 |

FOREIGN PATENT DOCUMENTS

| | | | |
|---|---|---|---|
| 57-193049 | 11/1982 | Japan | 357/81 |
| 58-166750 | 10/1983 | Japan | 357/81 |
| 58-225656 | 12/1983 | Japan | 357/81 |
| 59-117244 | 7/1984 | Japan | 357/81 |
| 60-31247 | 2/1985 | Japan . | |
| 63-16458 | 4/1988 | Japan . | |

OTHER PUBLICATIONS

Nutt, *Metallurgy & Plastics for Engineers*, 1977, pp. 200–210.

Hatch, *Aluminum: Properties and Physical Metallurgy*, 1984, pp. 413–424.

Primary Examiner—Edward J. Wojciechowicz
Attorney, Agent, or Firm—W. G. Fasse; D. H. Kane, Jr.

[57] ABSTRACT

A radiation member (10) for a semiconductor device is formed by an aluminum alloy member having a low thermal expansion aluminum alloy section (11) and a high radiation aluminum alloy section (12) which are joined and integrally formed with each other. A semiconductor device (13) is carried on the major surface of the low thermal expansion aluminum alloy section (11). The low thermal expansion coefficient aluminum alloy has an average thermal expansion coefficient of not more than $17 \times 10^{-6}/°C$. The high radiation aluminum alloy is larger in thermal conductivity than the low thermal expansion aluminum alloy.

10 Claims, 6 Drawing Sheets

MEMBER FOR CARRYING A SEMICONDUCTOR DEVICE

This application is a continuation of application Ser. No. 07/426,882, filed on Oct. 24, 1989 now abandoned.

FIELD OF THE INVENTION

The present invention relates to a member for carrying a semiconductor device such as a radiation member or a package employed for various semiconductor integrated circuit (IC) devices or the like, and more particularly, it relates to an aluminum alloy member for a semiconductor device, which has low thermal expansion and other characteristics.

BACKGROUND INFORMATION

A material forming a substrate for a semiconductor device must have a thermal expansion coefficient which is substantially similar to that of the semiconductor device, so that no distortion is caused by thermal stress. Thus, a material having a small difference in its thermal expansion coefficient, as compared to the semiconductor device, has been generally made of an Ni alloy such as ASTM F-15 (29 wt.% Ni - 17 wt.% Co—Fe) or ASTM F-30 (42 wt. % Ni—Fe), or a ceramic material such as alumina or forsterite.

In recent years, however, the semiconductor technique has been remarkably improved, resulting in an increase in scale and circuit density of such semiconductor devices. However, a problem of proper heat dissipation has arisen in addition to the aforementioned difference in thermal expansion coefficient. In other words, not only a small difference between the thermal expansion coefficients is needed, an excellent heat dissipation is also required as the semiconductor devices increase in size and circuit density.

Under such circumstances, beryllia, tungsten, molybdenum or the like has been generally proposed as a material which satisfies both of the above requirements.

However, beryllia, which is toxic, is practically unemployable in consideration of a health hazard and environmental pollution.

On the other hand, molybdenum and tungsten are very expensive since these elements are produced in few areas of the world in small amounts. Thus, use of such metal materials leads to increased costs for the semiconductor devices. Besides, such metals are heavy because of a relatively high density (19.3 g/cm$^3$ for tungsten and 10.2 g/cm$^3$ for molybdenum), while the same are relatively hard to machine.

Thus, a lightweight substrate material for a semiconductor device, which can satisfy both of the required characteristics of excellent heat dissipation and a small difference in thermal expansion coefficients while also having an excellent machinability, is very desirable.

Japanese Patent Publication No. 63-16458(1988) discloses an aluminum alloy prepared by adding 30 to 50 percent by weight of silicon to the aluminum. Such an alloy is used as a substrate material for a semiconductor device.

However, although the aforementioned alloy of Al - 30 to 50 wt. % Si has a thermal expansion coefficient which is substantially similar to that of a semiconductor element, its heat dissipation is reduced as compared with that of an ordinary aluminum alloy containing a small amount of silicon. In general, it has been possible to cope with the heat generation in a semiconductor device even if the heat dissipation of the aluminum alloy is reduced. As to a higher heating value following a high integration of a recent semiconductor element, however, it is difficult to sufficiently dissipate heat generated in the semiconductor element by a radiation member formed of only the aforementioned Al—Si alloy.

On the other hand, lightness and a high reliability against moisture resistance, heat resistance, etc. are particularly required for a package employed for a small and lightweight microwave integrated circuit device which is suitable for a mobile radio station such as a communication satellite, an aircraft or the like. In general, the package for a microwave integrated circuit device is made of a ferrous material such as stainless steel, iron-nickel-42% alloy or the like. However, such a ferrous material has a relatively large specific gravity of about 8 g/cm$^3$. Therefore, the ferrous material has been unsatisfactory as a package material for a microwave integrated circuit device which is carried on a satellite, an aircraft or the like. When a circuit element is highly integrated and the package is reduced in size and weight, the circuit carried on the package is damaged by heat generation since the ferrous material has a low thermal conductivity of 0.04 cal/°C.cm.sec.

In order to solve such problems, the use of an aluminum package has been recently studied. However, although a desired value of thermal conductivity can be obtained in a package material made of a general aluminum alloy according to Japanese Industrial Standards (JIS) or ASTM, such a material has a high thermal expansion coefficient of at least about $20 \times 10^{-6}$/°C., a value which is extremely different from that of a material forming a circuit substrate. When the circuit substrate is directly mounted on the surface of the package by Au—Sn solder or the like, the circuit substrate cracks due to thermal stress caused by the difference in thermal expansion coefficients. In order to solve this problem, it has been necessary to insert a member forming stress relaxation structure between the package and the circuit substrate. As the result, the overall structure of the package has been complicated.

It may be considered to reduce the thermal expansion coefficient of the aluminum alloy by adding at least 30 percent by weight, for example, of silicon to aluminum so that the content of silicon exceeds that of a conventional aluminum alloy according to JIS or ASTM. When such an Al—Si alloy is obtained by general casting, however, its machinability is extremely reduced since the particle size of primary silicon crystals is increased. Thus, it is difficult to precisely machine the alloy into a desired configuration required for a package.

Alternatively, the thermal expansion coefficient may be reduced by adding ceramic particles of silicon carbide or the like to aluminum. Also in this case, however, machinability of the alloy is substantially reduced.

When a package is manufactured, its members are suitably joined with each other by laser welding, to avoid a thermal effect on a microwave integrated circuit device which is carried within the case thereof. If a general aluminum alloy according to JIS is subjected to laser welding, however, cracking is caused following quenching since the welded zone is cooled at a higher rate than the cooling of the base metal. Thus, it is impossible to maintain an airtight package. In order to solve this problem, it has been proposed to insert an Al—Si brazing filler metal between the case and a lid member or to perform a nickel plating etc. for carrying out a laser welding step to solution-treat the nickel and silicon in the welding zone and to increase the heat resistance to prevent cracking as disclosed in Japanese Patent Laying-Open No. 58-223350(1983) or 60-31247(1985). Another method of utilizing a cast aluminum alloy having a high content of silicon as disclosed in Japanese Patent Laying-Open No. 58-223349(1983) also aims at solving the above problem. However, the former method requires an involved plating process or preparation of the brazing filler metal. In the latter method, the coarse primary silicon crystallizes as hereinabove described, which prevents a precise machining.

Further, a conventional aluminum alloy according to JIS has a lower Young's modulus of 7000 to 8000 kgf/mm$^2$ than a ferrous material such as stainless steel. Therefore, it is necessary to increase the thickness of a case in order to guarantee the mechanical strength of a package formed by such a conventional aluminum alloy. Thus, the package cannot be effectively miniaturized.

OBJECTS OF THE INVENTION

A first object of the present invention is to provide a lightweight radiation member for a semiconductor device having an excellent machinability, which can satisfy both requirements of an excellent heat dissipation and a small difference in thermal expansion coefficients required for dissipating the heat generated in a semiconductor element.

A second object of the present invention is to provide a package for a microwave integrated circuit device which satisfies a required high thermal conductivity and a low thermal expansion coefficient while also having a sufficient mechanical strength with reduced weight. Additionally, an excellent reliability in a welding zone and a good machinability are required.

A third object of the present invention is to provide a member for carrying a semiconductor device, which can satisfy the characteristic of a small difference in thermal expansion coefficients at least in a portion having a surface for carrying the semiconductor device thereon.

SUMMARY OF THE INVENTION

The foregoing objectives have been achieved according to the invention by making one section of the present member requiring a low thermal expansion and by making another section of the present member requiring a high heat dissipation, of different aluminum alloys and then integrally forming the different aluminum alloy sections by hot working.

The present heat radiating member for a semiconductor device comprises a first section of a first aluminum alloy having a major surface for carrying the semiconductor device thereon and a second section of a second aluminum alloy integrally joined/formed to the first section made of the first aluminum alloy. The first aluminum alloy has an average thermal expansion coefficient of not more than $17 \times 10^{-6}/°C$. The second aluminum alloy has a larger thermal conductivity than the first aluminum alloy.

The first aluminum alloy preferably contains 30 to 60 percent by weight of silicon, and the residual part thereof may be formed of aluminum and naturally present impurities. The content of silicon is limited to 30 to 60 percent by weight because the thermal expansion coefficient exceeds a desired value if the silicon content is less than 30 percent by weight, while the thermal conductivity, powder moldability and hot workability deteriorate substantially if the silicon content exceeds 60 percent by weight.

The present member for a semiconductor device, which is integrally formed of the first aluminum alloy section exhibiting a low thermal expansibility and the second aluminum alloy section exhibiting a high heat dissipation, has a high heat dissipation and a low thermal expansion as compared to a radiation member which is made of a conventional aluminum alloy.

It has been found that the aforementioned second object, can be attained in a package for a microwave integrated circuit device which has a satisfactory thermal expansion coefficient, thermal conductivity, and machinability by adding a large amount of silicon to aluminum so that the particle size of primary silicon crystals is not more than 50 μm.

The present package for a microwave integrated circuit device, comprises a container section formed of a first aluminum alloy and a lid section formed of a second aluminum alloy. These two members are joined to each other by laser beam welding and sealed to each other in an airtight manner. The container section has an inner surface for carrying the microwave integrated circuit device thereon, and an opening for receiving the microwave integrated circuit device therethrough. The first aluminum alloy contains 30 to 60 percent by weight of silicon and its residual part is formed of aluminum and naturally present impurities, while the particle size of primary silicon crystals is not more than 50 μm. The lid section is provided above the microwave integrated circuit device to protect the same, and adapted to cover or close the opening section of the container member.

The aluminum alloy forming the lid section may preferably be made of the same material as that for the aluminum alloy forming the container section. The thermal expansion coefficient of the aluminum alloy forming the container section may be not more than $17 \times 10^{-6}/°C$.

According to the present invention, the container section having an inner surface for carrying the microwave integrated circuit device thereon, is made of the aluminum alloy containing 30 to 60 percent by weight of silicon, whereby the difference in the thermal expansion coefficients between the same and a semiconductor element or a circuit substrate forming the microwave integrated circuit device, is small. Thus, it is possible to reduce distortions based on thermal stress caused between the microwave integrated circuit device and the container member. Further, it is also possible to prevent damage caused by heat generation of the device carried in the package since the aforementioned aluminum alloy is relatively excellent in heat dissipation.

Further, the machinability of the aluminum alloy is not reduced since the particle size of primary silicon crystals is not more than 50 μm. Thus, it is possible to precisely work the aluminum alloy into a desired configuration.

The aluminum alloy containing 30 to 60 percent by weight of silicon contributes to a reduction in weight of the package since its density is smaller than that of a general aluminum alloy. Moreover, the thickness of the container member forming the package can be further reduced since the aforementioned aluminum alloy has a higher Young's modulus as compared to the general aluminum alloy, whereby the package weight is additionally reduced.

When the container section formed of the aluminum alloy having the aforementioned composition, is joined with the lid section by laser welding, the base metal and the welding zone are merely slightly changed in their microstructure by the rapid solidification after the laser welding, since the particle size of primary silicon crystals contained in the aluminum alloy forming the container section is not more than 50 μm. Thus, it is possible to prevent cracking and to maintain the package airtight.

According to an aspect of the present invention, it is possible to provide a radiation member for a semiconductor device, which is formed by the aluminum alloy sections and has both characteristics of a low thermal expansion and a high heat dissipation. Thus, the radiation member is effectively applied to a semiconductor device having a high heat generation and requiring a high reliability. Further, the present radiation member for a semiconductor device can be easily reduced in weight since the same is formed by aluminum alloy sections.

According to another aspect of the present invention, it is possible to provide a small and lightweight package for a microwave integrated circuit device, which is sealed in an airtight manner. Thus, the present package is effectively employed in an artificial satellite, an aircraft and the like. Further, it is possible to increase the life of a device to be carried on the present package and improve its reliability, since the package can reduce distortion caused by thermal stress and has an excellent thermal dissipation. It is also possible to reduce the manufacturing cost since the present package can be reduced in weight and has an excellent machinability.

As hereinabove described, the present member for carrying a semiconductor device comprises at least a first section made of a first aluminum alloy having a major surface for carrying the semiconductor device thereon and a second section made of a second aluminum alloy. The first aluminum alloy has an average thermal expansion coefficient of not more than $17 \times 10^{-6}/°C$. The second section is joined to the first section. Thus, it is possible to at least reduce, with the aid of the first aluminum alloy, the distortion based on thermal stress caused between the semiconductor device and the present member. The second aluminum alloy section, which is joined to the first aluminum alloy section, can be formed to have other required characteristics such as a heat dissipation responsive to the calorific power of the semiconductor device, for example.

These and other objects, features, aspect and advantages of the present invention will become more apparent from the following detailed description of the present invention when in conjunction with the accompanying drawings.

DETAILED DESCRIPTION OF THE PREFERRED EXAMPLE EMBODIMENTS AND OF THE BEST MODE OF THE INVENTION

Figure 1A:
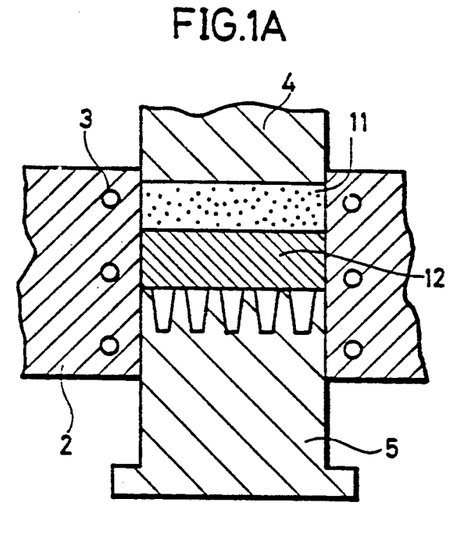
FIGS. 1A and 1B are partially fragmented sectional views showing an exemplary method of manufacturing a radiation member for a semiconductor device, according to the present invention.
Figure 1B:
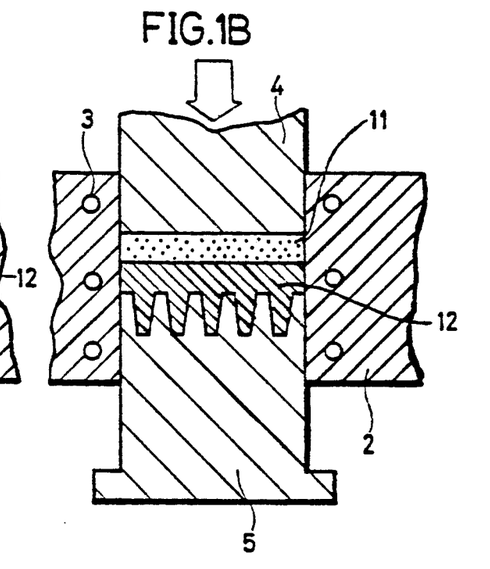

FIGS. 1A and 1B are partially fragmented sectional views showing an exemplary method of manufacturing a radiation member according to the present invention. Referring to FIG. 1A, a high radiation aluminum alloy section 12 formed of an aluminum alloy of JIS or ASTM nominal No. 1100, for example, is forced into a clearance defined between dies 2, which are heated to a temperature of 400° C. by heating elements 3, and a lower punch 5. Further, quench-solidified powder composed of Al - 40 wt. % Si, for example, is brought into contact with the high radiation aluminum alloy section 12, thereby to form a low thermal expansion aluminum alloy section 11. Thereafter the aluminum alloy sections 11 and 12 are pressurized by an upper punch 4 and the lower punch 5 along the arrow shown in FIG. 1B, so that portions of the high radiation aluminum alloy section 12 fill up slit-type grooves which are defined in the upper surface of the lower punch 5, to be formed into radiation fins. At the same time, the powder of Al - 40 wt. % Si forming the low thermal expansion aluminum alloy section 11 is solidified to form a diffused junction at the interface between the section 11 and the high radiation aluminum alloy section 12, so that the aluminum alloy sections 11 and 12 are integrated with each other.

Figure 2:
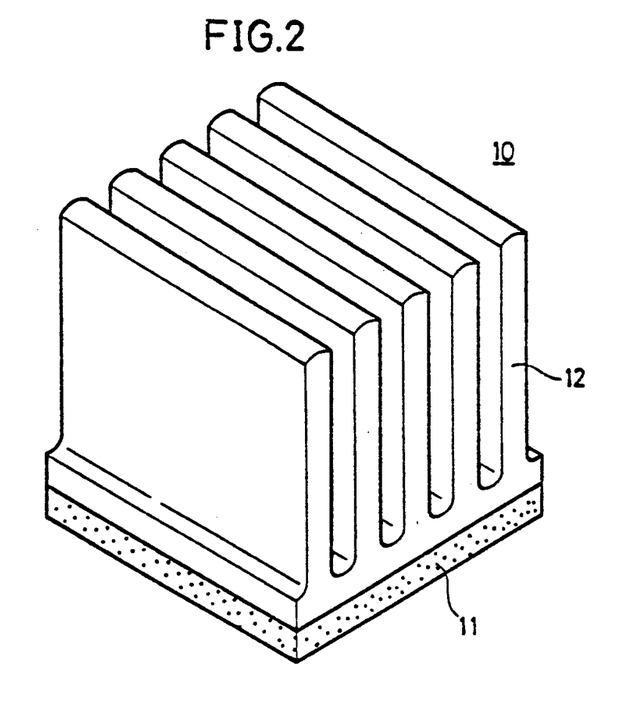
FIG. 2 is a perspective view showing an embodiment of the present radiation member for a semiconductor device, which member is obtained by the manufacturing method shown in FIGS. 1A and 1B.
Figure 9:
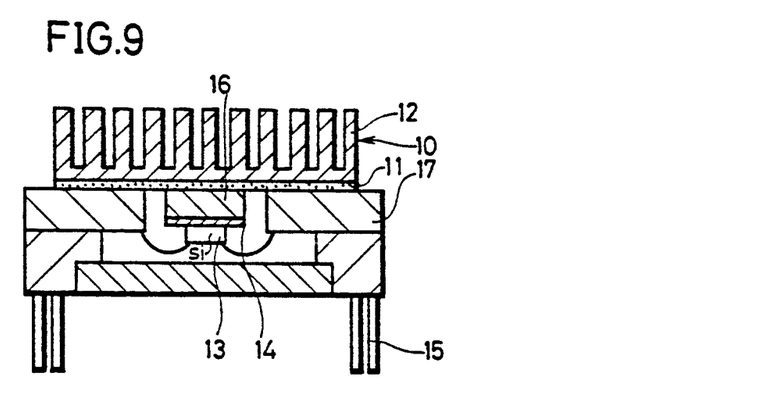
FIG. 9 is a sectional view showing an exemplary IC package into which the radiation member for a semiconductor device shown in FIG. 2 is integrated.

FIG. 2 shows a radiation member 10, which is formed by the low thermal expansion aluminum alloy section 11 integrated with the high radiation or heat dissipating section 12. FIG. 9 shows a sectional view through an exemplary IC package, wherein the radiation member 10 is integrated. Referring to FIG. 9, a semiconductor element 13 is joined to a copper-tungsten alloy substrate 16 through a solder member 14. The radiation member 10 is integrally joined with the copper-tungsten alloy substrate 16. This radiation member 10 is mounted on an upper surface of an envelope member 17 which is formed of a ceramic material such as alumina. Numeral 15 denotes Kovar wires which serve as terminals.

Figure 3A:
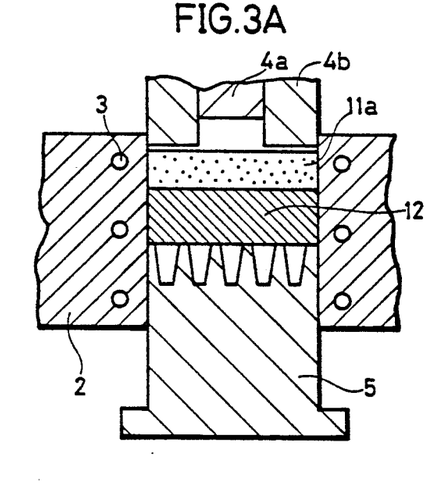
FIGS. 3A, 3B and 3C are partially fragmented sectional views showing another exemplary method of manufacturing a radiation member according to the present invention for a semiconductor device.
Figure 3B:
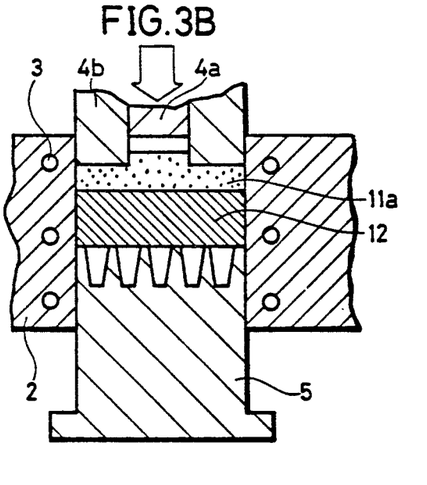
Figures 3C, 4:
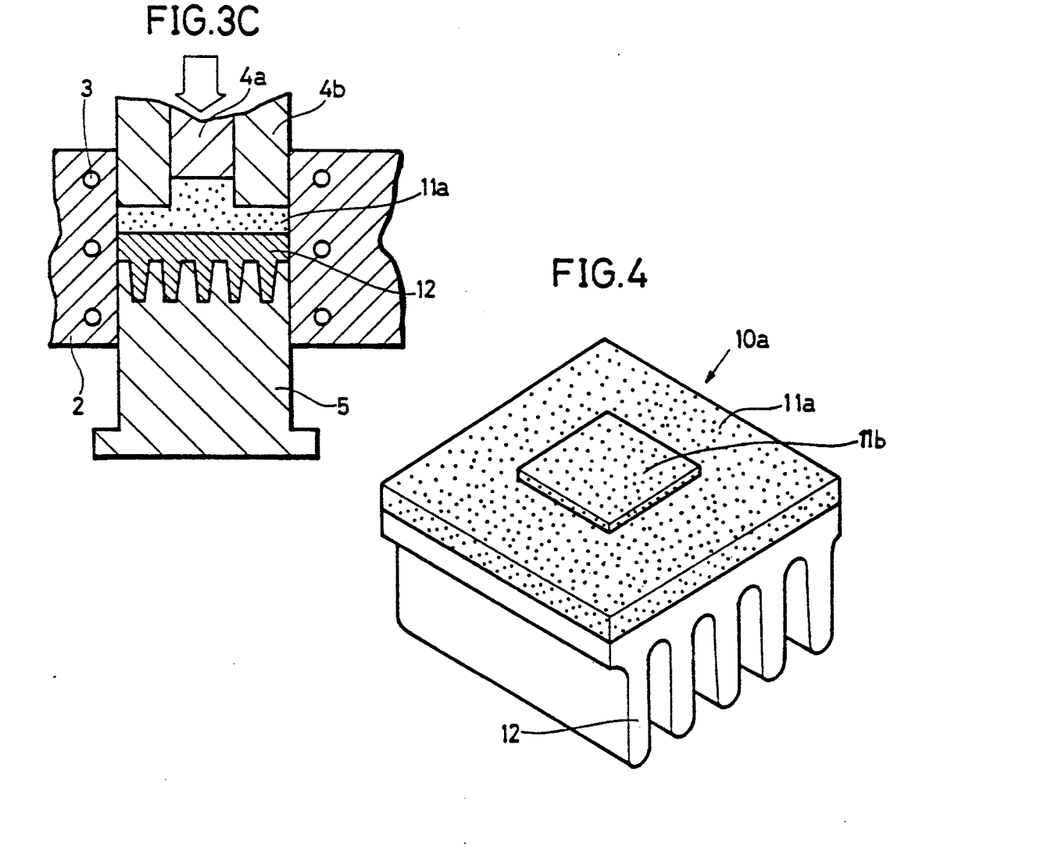
FIG. 4 is a perspective view showing another embodiment of the present radiation member for a semiconductor device, which member is obtained by the manufacturing method shown in FIGS. 3A to 3C.

FIGS. 3A, 3B and 3C are partially fragmented sectional views showing another exemplary method of manufacturing a radiation member according to the present invention. Similarly to the method shown in FIGS. 1A and 1B, a high radiation aluminum alloy section 12 and a low thermal expansion aluminum alloy section 11a are introduced into a clearance defined between dies 2, which are heated by heating elements 3, a lower punch 5 and upper punches 4a and 4b. Thereafter, the low thermal expansion section 12 are formed by pressing in the direction of the arrow shown in FIGS. 3B and 3C, to provide a radiation by integration of the aluminum alloy sections 11a and 12.

Figure 10:
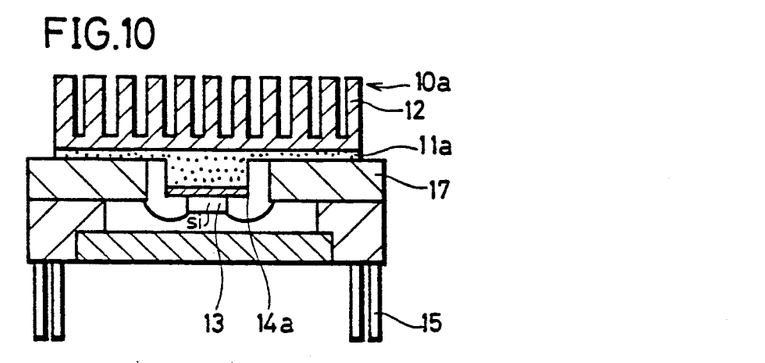
FIG. 10 is a sectional view showing another exemplary IC package into which the radiation member for a semiconductor device shown in FIG. 4, is integrated.

FIG. 4 shows a radiation member 10a thus obtained. The section 11a has a raised centrally located portion 11b. FIG. 10 is a sectional view showing an exemplary IC package to which the radiation member 10a is applied. According to this figure, a semiconductor element 13 is directly joined to the low thermal expansion aluminum alloy section 11a of the radiation member 10a by a sealant material 14a such as an Ag paste, dissimilarly to the IC package shown in FIG. 9. The other structure of this IC package is similar to that of the example shown in FIG. 9.

Figure 5:
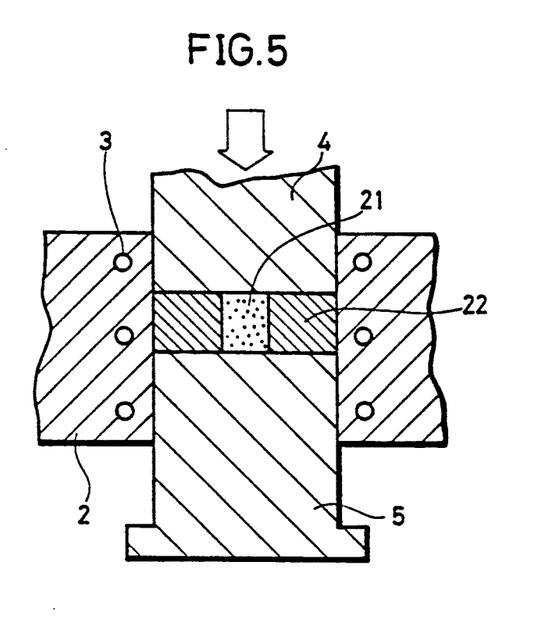
FIG. 5 is a partially fragmented sectional view showing still another exemplary method of manufacturing a radiation member for a semiconductor device, according to the present invention.
Figure 6:
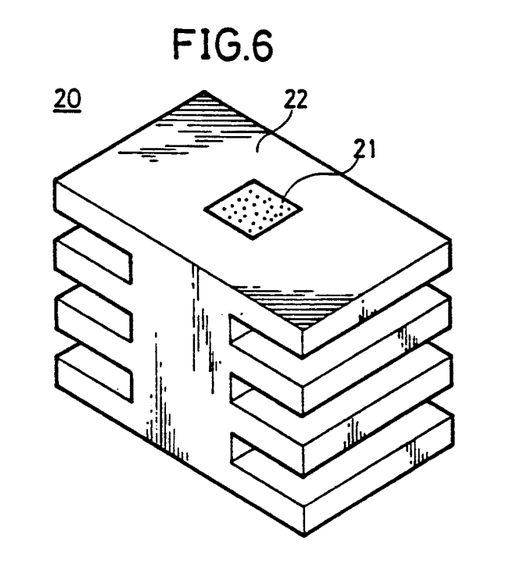
FIG. 6 is a perspective view showing still another embodiment of the present radiation member for a semiconductor device, which member is obtained by the manufacturing method shown in FIG. 5.

FIG. 5 is a partially fragmented sectional view showing still another exemplary method of manufacturing a radiation member according to the present invention. Referring to FIG. 5, a high radiation aluminum alloy section 22 prepared from a metal plate having a central hole, which is formed of the aluminum alloy of JIS or ASTM nominal No. 1100, for example, is forced into a clearance defined between dies 2, which are heated by heating elements 3, and a lower punch 5, similarly to the manufacturing method shown in FIG. 1. A low thermal expansion aluminum alloy section 21 made of quench-solidified powder of an aluminum alloy composed of Al - 40 wt. % Si is introduced in the central hole. Thereafter, the aluminum alloy sections 21 and 22 are pressurized in the direction of the arrow shown in this figure by an upper punch 4 and the lower punch 5, to form the member by compression. A formed body of the aluminum alloys thus obtained is subjected to machining for producing radiation fins in the outer peripheral portions. FIG. 6 shows a radiation member 20 thus obtained. Also this radiation member 20 can be integrated into an IC package.

Figure 7:
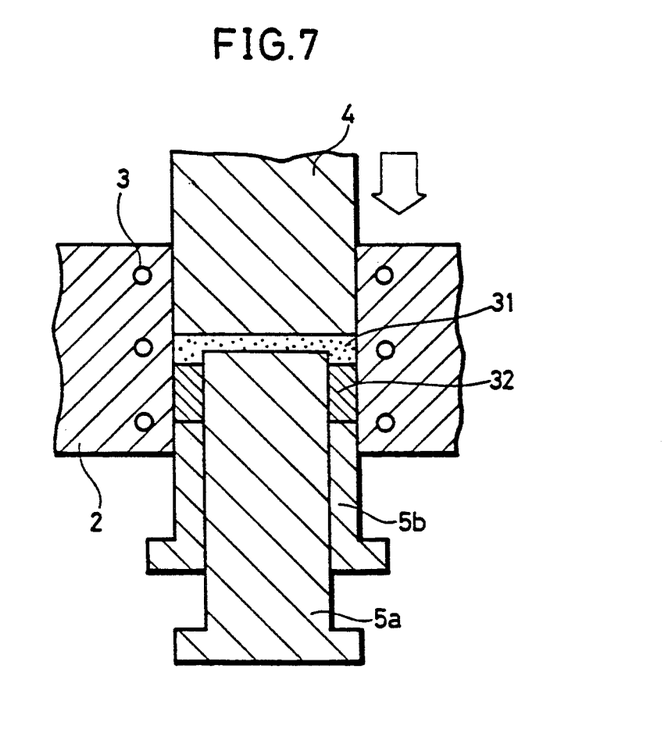
FIG. 7 is a partially fragmented sectional view showing a further exemplary method of manufacturing a radiation member for a semiconductor device, according to the present invention.
Figure 8:
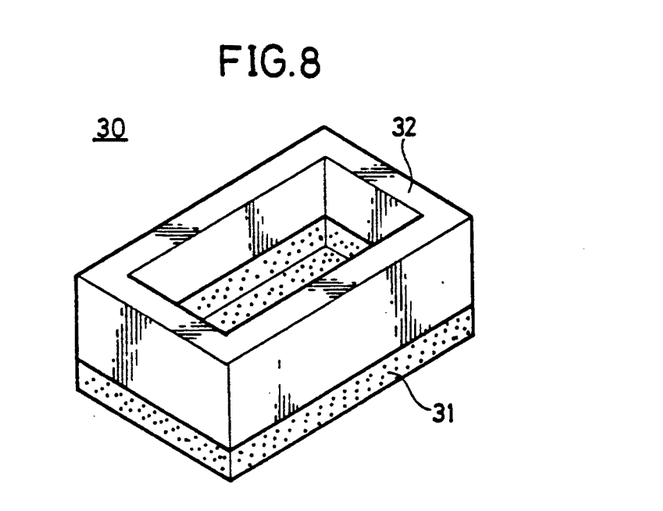
FIG. 8 is a perspective view showing a further embodiment of the radiation member for a semiconductor device which member is obtained by the manufacturing method shown in FIG. 7.

FIG. 7 is a partially fragmented sectional view showing a further exemplary method of manufacturing a radiation member according to the present invention. Referring to FIG. 7, a high radiation aluminum alloy section 32 formed as a frame of the aluminum alloy of JIS or ASTM nominal No. 1100, for example, is forced into a clearance defined between dies 2, which are heated by heating elements 3, and lower punches 5a and 5b. Further, a low thermal expansion aluminum alloy section 31 in the form of quench-solidified powder composed of Al - 40 wt. % Si is filled into a clearance which is defined between the lower punch 5a and an upper punch 4. Thereafter, the aluminum alloy sections 31 and 32 are formed by compression between the upper and lower punches 4, 5a and 5b as indicated by the arrow shown in FIG. 7, so that the aluminum alloy sections 31 and 32 are integrated with each other by a diffused junction to define a box. FIG. 8 shows a box-type radiation member 30 thus formed of the sections 31 and 32. Such a radiation member 30 is applied as a metal package for a microwave integrated circuit device, which is employed in a satellite, an aircraft or the like.

Figure 11:
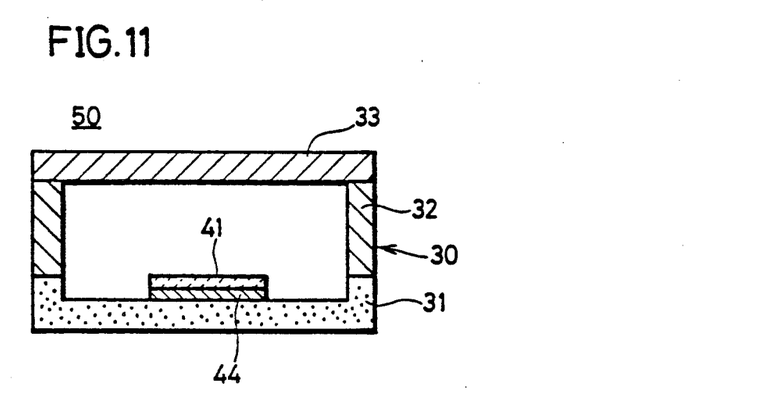
FIG. 11 is a sectional view showing an exemplary metal package into which the radiation member for a semiconductor device shown in FIG. 8, is integrated.

FIG. 11 is a sectional view showing the structure of a metal package 50 which is formed with the box-type radiation member 30 shown in FIG. 8. Referring to FIG. 11, an alumina circuit substrate 41 for a microwave integrated circuit device is joined to the inner bottom surface of the box-type radiation member 30 by a solder 44, which is an Au—Sn solder. An opening of this radiation member 30 is closed by a lid 33 of a JIS nominal high radiation aluminum alloy, for example, which is joined to the radiation member 30 by laser beam welding.

Although the low thermal expansion aluminum alloy is composed of Al - 40 wt. % Si in each of the above embodiments, the composition of the aluminum alloy is not restricted to this feature. For example, the low thermal expansion aluminum alloy may be prepared from Al—Si alloys containing 30 to 60 percent by weight of silicon and having composition ratios shown in Table 1.

Table 1 also shows thermal expansion coefficients and values of density and thermal conductivity of aluminum alloy members which are formed by hot plastic working of quench-solidified powder prepared by adding 30 to 60 percent by weight of silicon to the aluminum. Table 1 further shows values of Al—Si alloys containing 25 percent by weight and 65 percent by weight of silicon respectively, for the purpose of reference.

TABLE 1

| Composition Al—Si (wt. %) | Density (g/cm$^3$) | Thermal Expansion Coefficient ($\times 10^{-6}$/°C.) | Thermal Conductivity (cal/°C. · cm · sec) |
| --- | --- | --- | --- |
| Al-25Si | 2.60 | 17.4 | 0.38 |
| 30Si | 2.58 | 16.5 | 0.35 |
| 40Si | 2.53 | 13.5 | 0.30 |
| 50Si | 2.50 | 11.2 | 0.27 |
| 60Si | 2.43 | 9.8 | 0.25 |
| 65Si | 2.41 | 8.8 | 0.24 |

Although the high radiation aluminum alloy is prepared from the aluminum alloy of JIS or ASTM nominal No. 1100 in each of the above embodiments, the material therefor is not restricted to this feature. For example, the high radiation aluminum alloy may be prepared from any aluminum alloy shown in Table 2. Further, although the high radiation aluminum alloy member is formed by an aluminum alloy plate in each of the above embodiments, the same may be formed from powder of the same composition.

Although the low thermal expansion aluminum alloy is prepared from the Al—Si alloy in the embodiments of the present invention, the same may be prepared by adding carbon to aluminum thereby to reduce the thermal expansion coefficient.

The high radiation aluminum alloys listed in Table 2 have an excellent machinability, whereby the working costs can be reduced even if machine work is required to provide radiation members having complex configurations.

TABLE 2

| Type of Aluminum Alloy (JIS/ASTM Nominal No.) | Thermal Conductivity (25° C.) (Cal/°C. · cm · sec) |
| --- | --- |
| 1060 | 0.56 |
| 1100 | 0.53 |
| 1200 | 0.52 |
| 2011 | 0.41 |
| 2014 | 0.46 |
| 2017 | 0.46 |
| 2024 | 0.46 |
| 2219 | 0.41 |
| 3003 | 0.46 |
| 3105 | 0.41 |
| 5005 | 0.48 |
| 5050 | 0.46 |
| 6061 | 0.43 |
| 6N01 | 0.51 |
| 6063 | 0.50 |
| 6151 | 0.52 |
| 7072 | 0.53 |

According to Table 1, the thermal expansion coefficient exceeds a desired value when the content of silicon is less than 30 percent by weight, which makes it difficult to directly mount a circuit substrate. When the content of silicon exceeds 60 percent by weight, on the other hand, the thermal conductivity is so reduced that the desired heat dissipation cannot be attained. Additionally, the machinability is poor because the silicon increases the hardness. According to the present invention, therefore, the silicon content of the aluminum alloy employed for a container member forming a package for a microwave integrated circuit device, is limited within the range of 30 to 60 percent by weight.

Table 3 shows the density, the Young's modulus, and the specific rigidity of the exemplary aluminum alloy of Al - 40 wt. % Si forming the present container member, and of stainless steel and the aluminum alloy of JIS nominal No. 1100 for comparing.

TABLE 3

| Material | Density (g/cm$^3$) | Young's Modulus (Kgf/mm$^2$) | Specific Rigidity ($\times 10^6$ mm) |
| --- | --- | --- | --- |
| Stainless Steel | 8.0 | 20,000 | 2,500 |
| Al Alloy (JIS1100) | 2.7 | 7,200 | 2,666 |
| Al-40 wt. % Si | 2.53 | 10,300 | 4,071 |

According to Table 3, the aluminum alloy composed of Al - 40 wt. % Si has a Young's modulus of 10300 kgf/mm$^2$ under room temperature, which value is higher by at least 40% than that of 7200 kgf/mm$^2$ of the aluminum alloy of JIS or ASTM nominal No. 1100, listed as an example of a general aluminum alloy. Thus, it is possible to reduce the thickness of a case or a lid forming a package by employing the Al - 40 wt. % Si alloy as compared with the package formed of the general aluminum alloy.

The exemplary general aluminum alloy of JIS nominal No. 1100 has a smaller specific gravity than stainless steel which is listed as an exemplary ferrous material, while the former is not substantially different from the latter in specific rigidity since the Young's modulus thereof is small. In a package made of the general aluminum alloy, therefore, a case, a lid, and the like forming the package are inevitably increased in thickness and hence the characteristics of the aluminum alloy cannot contribute to a reduction in the size and weight of the package. On the other hand, when the Al - 40 wt. % Si alloy having a specific rigidity 1.6 times that of stainless steel, is applied to a package material, for example, the total weight of the package can be reduced by about 40% as compared to that of stainless steel, although the thickness thereof is slightly increased as compared to that of the stainless steel package.

According to the present invention, the primary silicon crystal contained in the aluminum alloy which is applied to the container member forming the package for a microwave integrated circuit device is not more than 50 μm in particle size. If the particle size of the primary silicon crystal exceeds 50 μm, the machinability is reduced and pinholes, nonuniformities, etc., form during surface treatment. In a welding zone of the container member which is joined with a lid, the silicon particle size is preferably not more than 20 μm. If the silicon particle size at the welding zone exceeds 20 μm and laser beam welding is applied, laser heat input to the welding zone is excessively increased when the same is welded by a CO$_2$ laser, for example, due to a reduced cooling rate at the welding zone. Such reduction in the cooling rate of the welding zone leads to blisters, which hinders forming an airtight welding zone.

Examples of the present package for a microwave integrated circuit device, are now described.

EXAMPLE 1

Powder of an Al - 40 wt. % Si alloy was prepared by a gas atomizing method at an average cooling rate of at least 10$^2$ K/sec., so that the alloy powder was not more than 42 mesh. The average particle size of silicon crystal contained in the powder thus obtained was not more than 50 μm.

Thereafter, the powder was heated to a temperature of at least 500° C., and formed into a plate member by extrusion. This plate member had a density of 2.53 g/cm$^3$, a thermal expansion coefficient of 13.3×10$^{-6}$/°C., and a thermal conductivity of 0.3 cal/°C.cm.sec.

A microwave integrated circuit substrate of Al$_2$O$_3$, on which a semiconductor element was mounted, was secured to the plate member of the Al - 40 wt. % Si alloy by an Au—Sn solder. The joined plane of the circuit substrate was tungsten-metallized. Table 4 shows the sizes of samples of the Al$_2$O$_3$ substrate thus joined. Samples of a similar Al$_2$O$_3$ substrate were joined to plate members of an aluminum alloy of JIS or ASTM nominal No. 5052 for reference. Table 4 also shows the result of a heat cycle test made on each sample thus prepared, in a temperature range of −65° to 150° C. for 100 cycles. According to Table 4, no defect such as separation, was recognized between the microwave integrated circuit substrate and the plate member of the aluminum alloy composed according to the present invention.

TABLE 4

| Sample | Size of Al$_2$O$_3$ Substrate (mm) × (mm) | | |
| --- | --- | --- | --- |
|  | 8 × 16 | 16 × 24 | 24 × 32 |
| Al-40 wt. % Si | ○ | ○ | ○ |
| Al Alloy (JIS 5052) | X | X | X |

○: No Defect
X: Separated After Soldering

EXAMPLE 2

Figure 12:
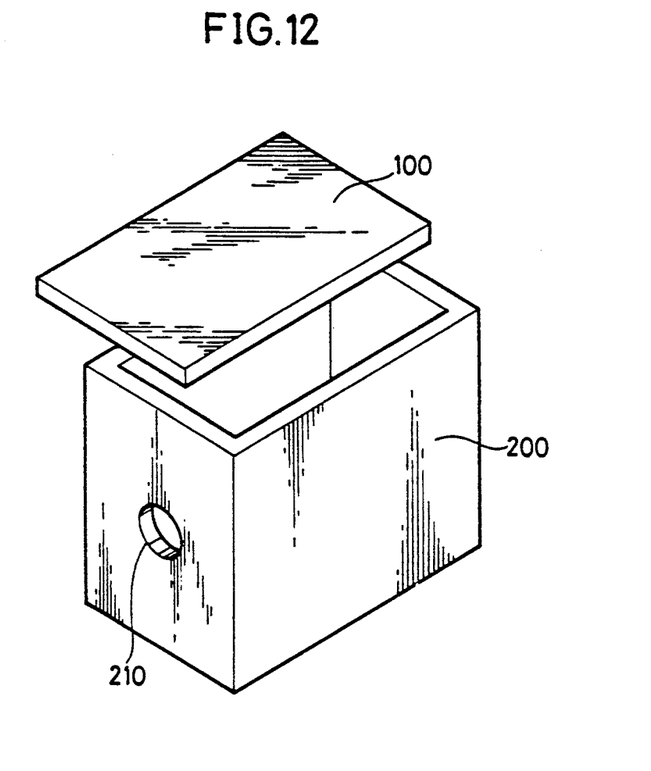
FIG. 12 is a schematic perspective view showing a package for a microwave integrated circuit according to the present invention.

The plate member of the Al - 40 wt. % Si alloy obtained in Example 1 was employed for manufacturing a package shown in FIG. 12, which was formed by a lid 100 and a case 200. The case 200 was provided with a hole 210 for a lead terminal, and a microwave integrated circuit substrate (not shown) was mounted within the case 200.

Figure 13:
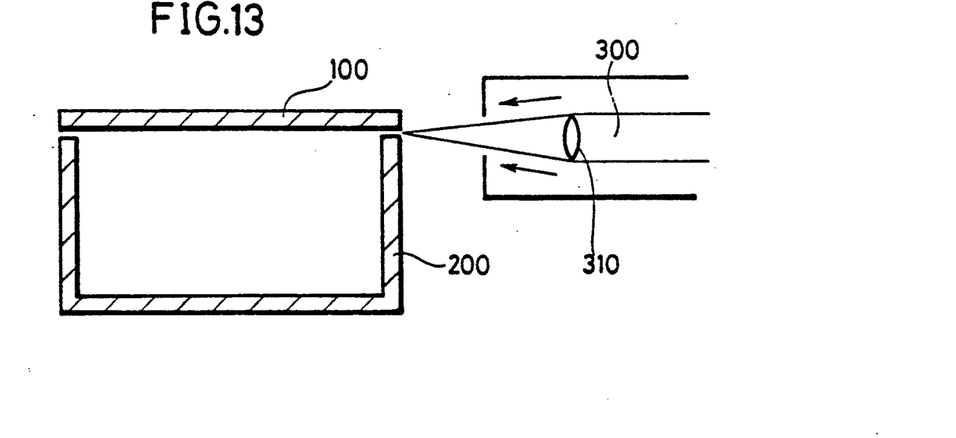
FIG. 13 is a schematic sectional view showing a method of laser beam welding for joining a lid and a case for manufacturing the package shown in FIG. 12.

FIG. 13 shows a method of laser beam welding employed for manufacturing the package. Referring to FIG. 13, a laser beam 300 focussed by a lens 310 was applied between the case 200 and the lid 100. Simultaneously, argon gas was supplied as shown by arrows, to serve as sealing gas.

The lid 100 and the case 200 were joined to each other by the method shown in FIG. 13. The laser beam 300 was emitted by a YAG pulser laser in an average output of 100 to 200 W, with a pulse width of 5 to 9 msec. at a pulse rate of 15 to 20 p/sec. The laser welding was performed at a welding speed of 80 to 130 mm/min.

The package thus obtained had a high strength and a fine structure, since the lid 100 and the case 200 were made of quench-solidified powder. Thus, the base metal and the welding zone were merely slightly changed in structure by quench solidification after the laser welding, while no cracking was caused and no blowholes were recognized. Then, the airtightness of the package was examined by a helium leakage test, to find that the airtightness of about $1.2 \times 10^{-10}$ cc/sec was maintained after a heat cycle test performed within a temperature range of $-65°$ to $150°$ C. for 100 cycles. Further, a shear fracture test was performed in order to examine the strength of the junction between the lid 100 and the case 200. The shearing force thus measured was at least 100 kg, a value which was sufficient in handling of the package.

Although the aluminum alloy forming the lid and the case was composed of an Al - 30 to 60 wt. % Si alloy in each of the above examples, at least only the case serving as a container member for the package, may be made of the Al—Si alloy having the aforementioned composition, and the lid member may be made of a general aluminum alloy according to JIS or ASTM.

As hereinabove described, the present invention can provide a radiation or heat dissipating member of aluminum alloys for a semiconductor device, which has both desired characteristics, namely a low thermal expansion and a high heat dissipation, as well as a package for a microwave integrated circuit device which has a sufficient mechanical strength for achieving a weight reduction in addition to the aforementioned two characteristics. The present member also has an excellent machinability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A radiation member for dissipating heat from a semiconductor device, comprising a mounting section made of a first aluminum alloy and having a major surface for mounting said semiconductor device thereon, said first aluminum alloy having an average thermal expansion coefficient of not more than $17 \times 10^{-6}/°C.$; and a heat sink section made of a second aluminum alloy integrally and directly joined without any intermediate layer to said mounting section made of said first aluminum alloy, said second aluminum alloy of said heat sink section having a thermal conductivity of at least 0.41 cal/°C.cm.sec. which is larger than a thermal conductivity of said first aluminum alloy, said heat sink section having a heat radiating surface for dissipating heat generated by said semiconductor device.

2. The radiation member of claim 1, wherein said first aluminum alloy of said mounting section contains 30 to 60 percent by weight of silicon and a remainder containing aluminum and naturally occurring impurities.

3. The radiation member of claim 1, wherein said heat radiating surface of said heat sink section includes heat dissipating fins.

4. The radiation member of claim 1, wherein said major mounting surface of said mounting section has a raised portion (11b).

5. The radiation member of claim 1, wherein said mounting section is integrally secured without any intermediate layer to said heat sink section in a hole of said heat sink section.

6. A container member for a microwave integrated circuit device, comprising a mounting section made of a first aluminum alloy having an inner surface for mounting said microwave integrated circuit device thereon, said first aluminum alloy having an average thermal expansion coefficient of not more than $17 \times 10^{-6}/°C.$ and a frame section made of a second aluminum alloy having side walls integrally and directly joined without any intermediate layer to said first mentioned mounting section, said second aluminum alloy of said frame section having a thermal conductivity of at least 0.41 cal/°C.cm.sec which is larger than a thermal conductivity of said first aluminum alloy, said frame section having surface means for dissipating heat generated by said microwave integrated circuit device, whereby said frame section functions as a heat sink for said integrated circuit device.

7. A package for a microwave integrated circuit device, comprising a container section made of a first aluminum alloy having an inner surface for carrying said microwave integrated circuit device thereon, and an opening for receiving said microwave integrated circuit device therethrough, said first aluminum alloy containing 30 to 60 percent by weight of silicon and a residual part including aluminum and naturally occurring impurities, said first aluminum alloy having primary silicon crystals therein having a particle size of not more than 50 μm; a lid section made of a second aluminum alloy for closing said opening of said first container section for protecting said microwave integrated circuit, and a laser welded seam directly joining said container section and said lid section to each other without any intermediate layer, said laser welded seam forming an airtight seal, and wherein said second aluminum alloy of said lid section has a thermal conductivity of at least 0.41 cal/°C.cm.sec, whereby said lid section functions as a heat sink for said integrated circuit device.

8. The package of claim 7, wherein said first aluminum alloy and said second aluminum alloy are the same alloy.

9. The package of claim 7, wherein said first aluminum alloy has a thermal expansion coefficient of not more than $17 \times 10^{-6}/°C.$ 10. A member for carrying a semiconductor device, comprising a mounting section made of a first aluminum alloy having a major surface for mounting said semiconductor device, said first aluminum alloy having an average thermal expansion coefficient of not more than $17 \times 10^{-6}$/C.; and a heat sink section made of a second aluminum alloy integrally and directly joined without any intermediate layer to said mounting section made of said first aluminum alloy, said heat sink section having a heat radiating surface for dissipating heat generated by said semiconductor device, and wherein said second aluminum alloy of said heat sink section has a thermal conductivity of at least 0.41 cal/°C.cm.sec.

* * * * *